United States Patent
Choi et al.

(10) Patent No.: US 12,464,920 B2
(45) Date of Patent: Nov. 4, 2025

(54) SUPPRESSING SCATTERING OF LIGHT TRANSMITTED THROUGH OLED DISPLAYS

(71) Applicant: GOOGLE LLC, Mountain View, CA (US)

(72) Inventors: Sangmoo Choi, Palo Alto, CA (US); Jyothi Karri, San Jose, CA (US); Ion Bita, Santa Clara, CA (US); Chia-Kai Liang, San Jose, CA (US)

(73) Assignee: Google LLC, Mountain View, CA (US)

( * ) Notice: Subject to any disclaimer, the term of this patent is extended or adjusted under 35 U.S.C. 154(b) by 652 days.

(21) Appl. No.: 17/627,041

(22) PCT Filed: Sep. 17, 2020

(86) PCT No.: PCT/US2020/051183
§ 371 (c)(1),
(2) Date: Jan. 13, 2022

(87) PCT Pub. No.: WO2021/055547
PCT Pub. Date: Mar. 25, 2021

(65) Prior Publication Data
US 2022/0278186 A1    Sep. 1, 2022

Related U.S. Application Data

(60) Provisional application No. 62/901,526, filed on Sep. 17, 2019.

(51) Int. Cl.
*H10K 59/35* (2023.01)
*H10K 50/86* (2023.01)
(Continued)

(52) U.S. Cl.
CPC ........... *H10K 59/352* (2023.02); *H10K 50/86* (2023.02); *H10K 59/131* (2023.02); *H10K 59/65* (2023.02);
(Continued)

(58) Field of Classification Search
CPC ........... H10K 59/8791; H10K 59/8792; H10K 71/166; H10K 50/865; H10K 59/352;
(Continued)

(56) References Cited

U.S. PATENT DOCUMENTS 9,312,312 B1    4/2016    Tsai et al.
10,121,831 B2    11/2018    Rappoport et al.
(Continued)

FOREIGN PATENT DOCUMENTS

CN    110061014 A    7/2019
EP    3654382 A2    5/2020
(Continued)

OTHER PUBLICATIONS

International Preliminary Report on Patentability in International Appln. No. PCT/US2020/051183, dated Mar. 31, 2022, 9 pages.
(Continued)

*Primary Examiner* — Didarul A Mazumder
(74) *Attorney, Agent, or Firm* — Fish & Richardson P.C.

(57) ABSTRACT

An apparatus includes a display panel having a first pixel area having a first pixel density and a second pixel area having a second pixel density higher than the first, the panel configured to generate images viewable from a front side and a sensor positioned at the back side arranged to receive incident light transmitted from the front to the back through the first pixel area. The first pixel area has light emitting pixels and signal lines electrically connecting pixel circuits associated with the pixels, and the panel includes a layer having a light blocking material patterned to provide apertures to transmit the incident light between some of the light emitting pixels and the signal lines and to block the incident light from the pixel circuits and the signal lines. Apertures can have different dimensions.

16 Claims, 12 Drawing Sheets

(51) Int. Cl.
  *H10K 59/126* (2023.01)
  *H10K 59/131* (2023.01)
  *H10K 59/65* (2023.01)
  *H10K 59/80* (2023.01)

(52) U.S. Cl.
  CPC ....... *H10K 59/8792* (2023.02); *H10K 59/126* (2023.02); *H10K 59/8791* (2023.02)

(58) Field of Classification Search
  CPC .. H10K 59/353; H10K 59/121; H10K 59/126; H10K 50/86; H10K 59/40; H10K 59/65
  USPC ....................................... 257/40; 438/82, 99
  See application file for complete search history.

(56) References Cited

U.S. PATENT DOCUMENTS

| | | |
|---|---|---|
| 10,756,136 B1 | 8/2020 | Ma et al. |
| 2007/0176854 A1 | 8/2007 | Ward et al. |
| 2011/0298953 A1 | 12/2011 | Nakamura |
| 2014/0231790 A1* | 8/2014 | Fujino ................ H10K 59/8792 257/89 |
| 2017/0193876 A1 | 7/2017 | Choi et al. |
| 2018/0246257 A1* | 8/2018 | Genier ...................... C03C 3/06 |
| 2019/0212788 A1* | 7/2019 | Kwak ..................... G06F 3/041 |

FOREIGN PATENT DOCUMENTS

| | | |
|---|---|---|
| WO | WO 2019242510 A1 | 12/2019 |
| WO | WO 2020073954 A1 | 4/2020 |

OTHER PUBLICATIONS

International Search Report and Written Opinion in International Appln. No. PCT/US2020/051183, dated May 18, 2021, 11 pages.
Office Action in European Appln. No. 20786119.6, mailed on Mar. 13, 2024, 10 pages.

* cited by examiner

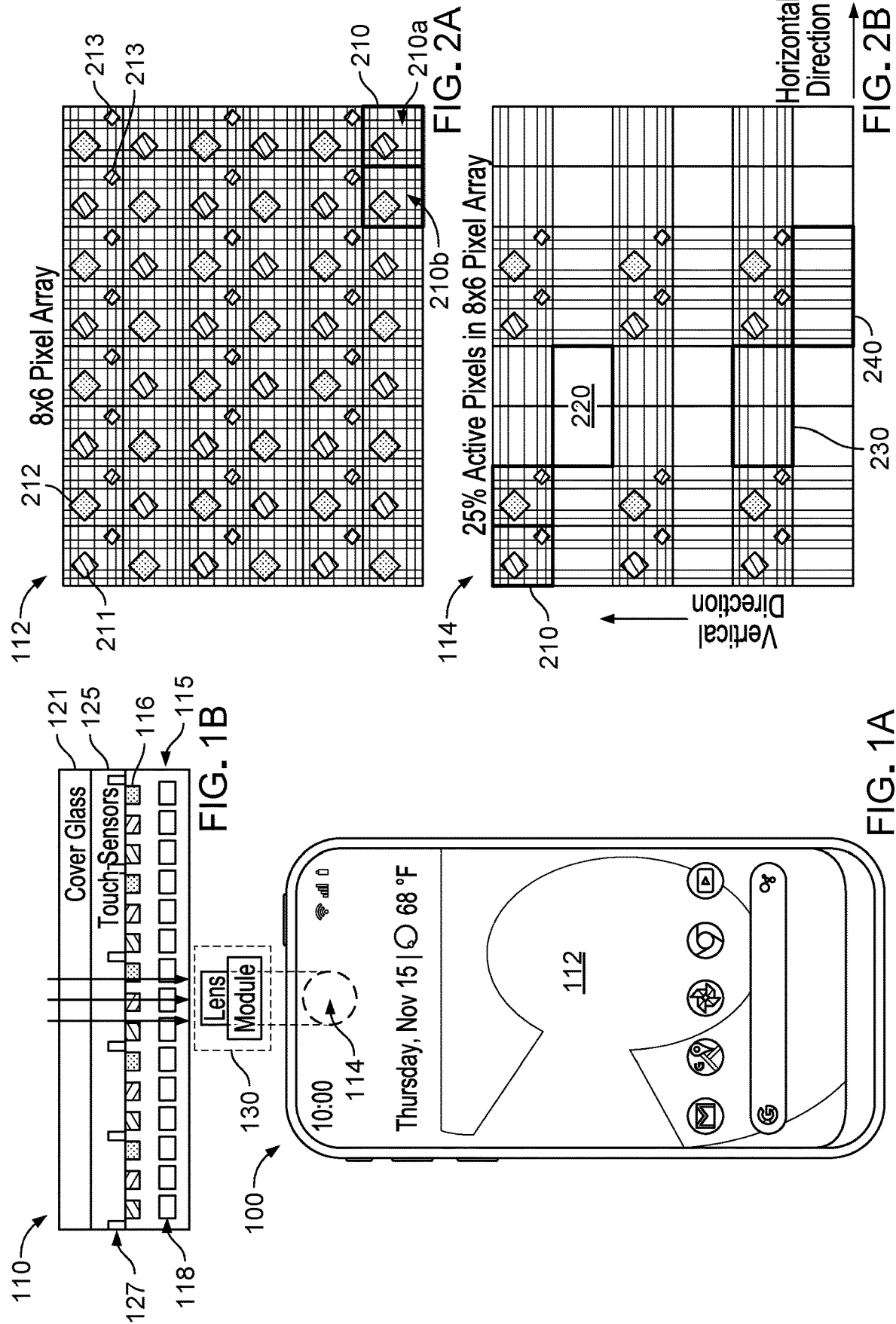

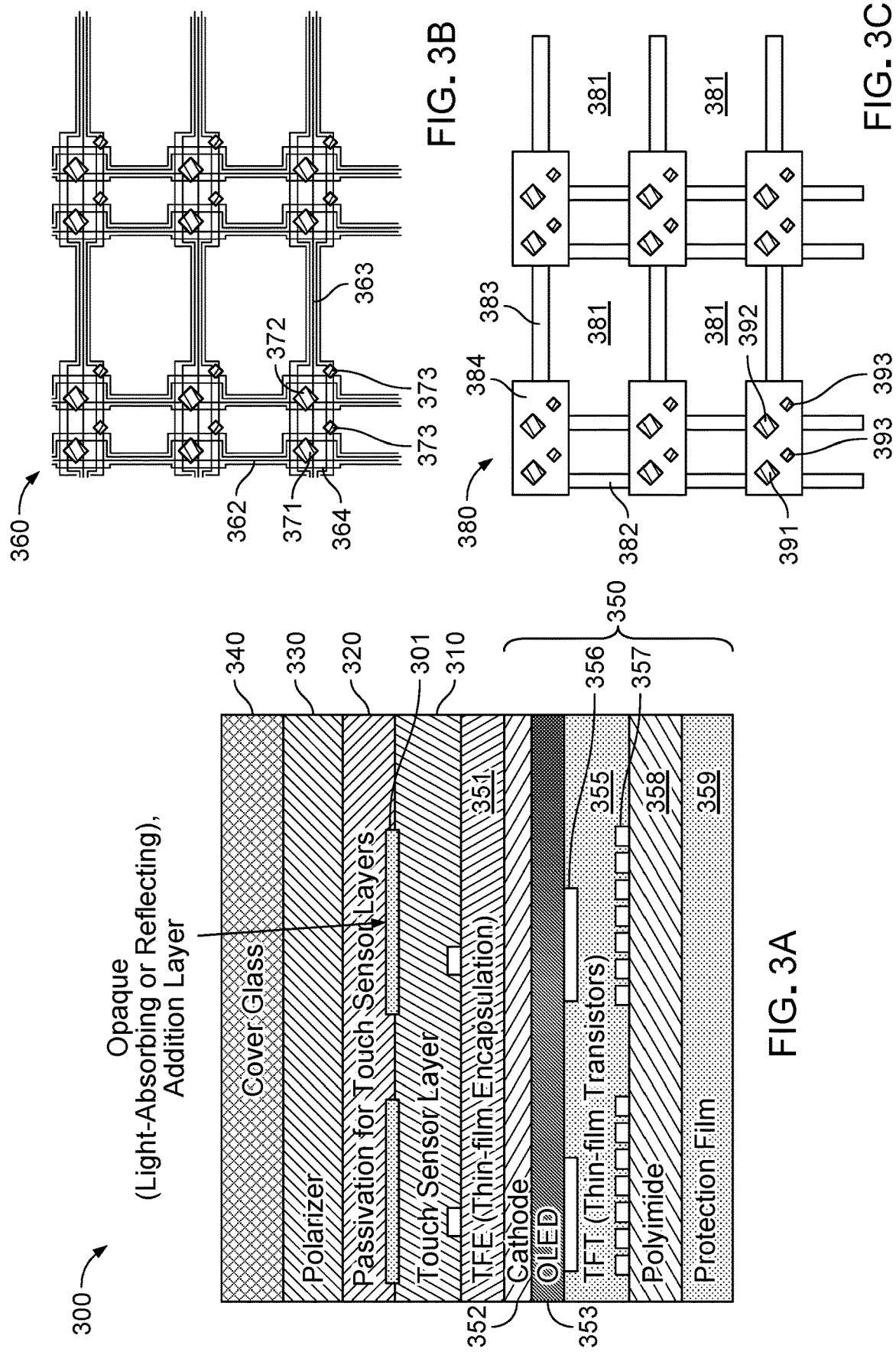

290μm

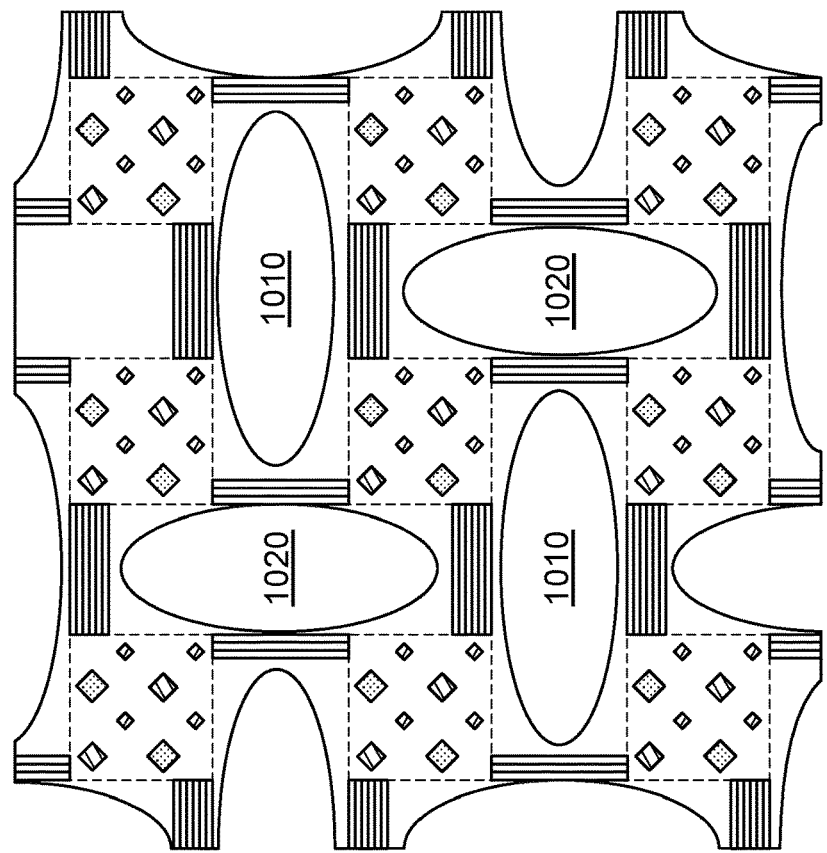
FIG. 10A
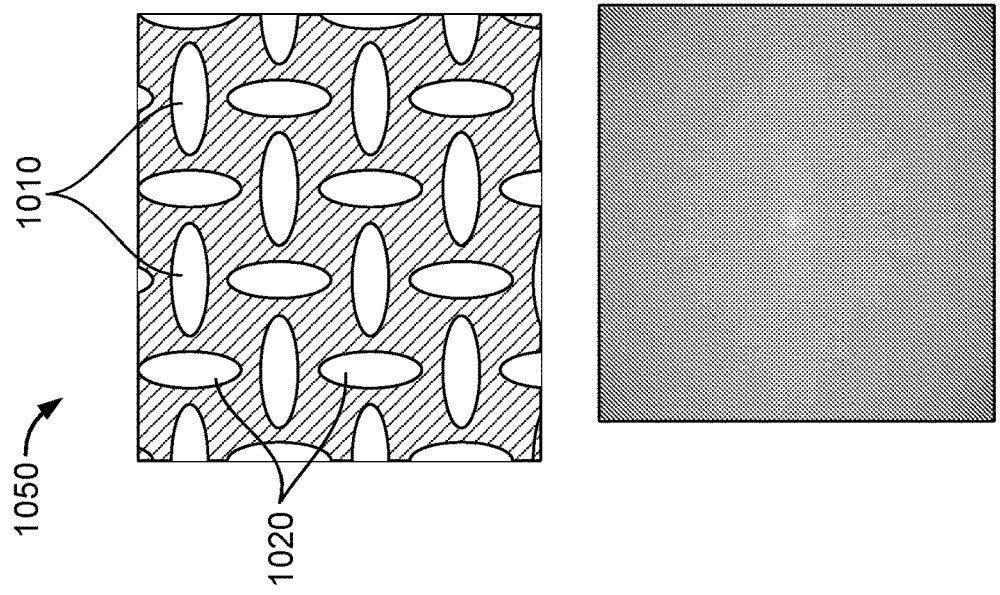
FIG. 10B
FIG. 10C

SUPPRESSING SCATTERING OF LIGHT TRANSMITTED THROUGH OLED DISPLAYS

CROSS-REFERENCE TO RELATED APPLICATION

This application is a national phase entry under 35 U.S.C. 371 of PCT Application No. PCT/US2020/051183, filed on Sep. 17, 2020, which claims priority to U.S. Patent Application No. 62/901,526, filed on Sep. 17, 2019, the entire contents of which are herein incorporated by reference.

BACKGROUND

This disclosure relates to displays, particularly organic light emitting diode (OLED) displays that include front facing sensors, such as a camera, beneath the display panel. When placing cameras under display panels, such as in bezel-less smartphones, the images captured by the camera through the display panel can suffer from severe haze. For example, the pixel circuits and trace lines connecting the pixel circuits can scatter light as it passes through the display panel. This effect can be particularly pronounced in high resolution displays with high pixel densities, such as those used in many smartphones.

SUMMARY

In general, in a first aspect, the invention features an apparatus that includes a display panel having a first pixel area having a first pixel density and a second pixel area having a second pixel density higher than the first pixel density, the display panel configured to generate images viewable from a front side of the display panel; and a sensor positioned at the back side of the display and arranged to receive incident light transmitted from the front side of the display to the back side of the display through the first pixel area. The first pixel area has light emitting pixels and signal lines electrically connecting pixel circuits associated with the light emitting pixels, and the display panel includes a layer having a light blocking material patterned to provide apertures to transmit the incident light between at least some of the light emitting pixels and the signal lines and to block the incident light from the pixel circuits and the signal lines. The apertures include first apertures and second apertures, the first apertures having a first dimension in a first direction and the second apertures having a second dimension in a second direction, the first dimension being different from the second dimension.

Embodiments of the apparatus can include one or more of the following features. For example, at least some of the light emitting pixels are arranged in pixel clusters. The pixel clusters can include two or more pixels (e.g., four or more pixels).

The first direction may be different from the second direction. The first direction may be orthogonal to the second direction.

A separation between the light emitting pixels can vary in at least one direction. By a separation between the light emitting pixels varying in at least one direction, it may be meant that a separation between a first pair of adjacent pixels within the first pixel area may be different to a separation between a second pair of adjacent pixels within the first pixel area.

The apertures can be arranged non-periodically in the first direction, e.g., in a horizontal direction. By being arranged non-periodically, it may be meant that a dimension and/or separation of apertures in the first direction may not be constant for every aperture along the first direction.

The first direction may be a horizontal direction. At least some of the apertures can have a different dimension in a vertical direction orthogonal to the horizontal direction. By having a different dimension, it may be meant that at least some of the apertures have horizontal and vertical dimensions that are not equal to one another (e.g., at least some of the apertures are not square or circular).

The apertures can be arranged non-periodically in the second direction. By being arranged non-periodically, it may be meant that a dimension and/or separation of apertures in the second direction may not be constant for every aperture along the second direction.

At least some of the apertures can be rectilinear in shape.

In some embodiments, at least some of the apertures are elliptical or circular in shape. The apertures can include elliptical apertures of differing ellipticity. The apertures can include elliptical or circular apertures of differing size.

In some embodiments, some of the apertures can be rectilinear in shape, while others of the apertures are elliptical or circular in shape.

In some embodiments, the apertures are arranged such that they introduce a haze of less than 1.9% measured using a method compliant with ASTM D1003.

The first and second dimensions can be 50 µm or more.

The sensor can be a camera.

The apparatus can be a smartphone or a tablet computer.

The display can be an organic light emitting diode (OLED) display.

The light blocking layer may be provided in front of the light emitting pixels.

The light blocking layer may further include pixel apertures configured to allow light from the pixels to be emitted from the front side of the display.

In some embodiments, the signal lines are arranged in vertical and/or horizontal lines that lie along common vertical and/or horizontal lines extending between adjacent pixels and/or pixel clusters in the first pixel area. In certain embodiments, the signal lines are arranged in vertical and/or horizontal lines that are offset from one another. Alternate horizontal signal lines and/or vertical signal lines may be offset. For example, the horizontal signal lines may be arranged such that a first horizontal line portion linking a first pixel cluster and a second adjacent pixel cluster, is offset in a vertical direction with respect to a second horizontal line portion linking the second pixel cluster and a third pixel cluster adjacent to the second pixel cluster. Additionally, or in the alternative, the vertical signal lines may be arranged such that a first vertical line portion linking a fourth pixel cluster and a fifth adjacent pixel cluster, is offset in a horizontal direction with respect to a second vertical line portion linking the fifth pixel cluster and a sixth pixel cluster adjacent to the fifth pixel cluster.

In general, in another aspect, the invention features an apparatus that includes a display panel including a first pixel area having a first pixel density and a second pixel area having a second pixel density higher than the first pixel density, the display panel configured to generate images viewable from a front side of the display panel; and a sensor positioned at the back side of the display and arranged to receive incident light transmitted from the front side of the display to the back side of the display through the first pixel area. The first pixel area includes light emitting pixels arranged in pixel clusters and signal lines electrically connecting pixel circuits associated with the pixel clusters. The display panel includes a layer with a light blocking material patterned to provide apertures to transmit the incident light between the pixel clusters and the signal lines and to block the incident light from the pixel clusters and the signal lines. At least some of the apertures are elliptical or circular in shape.

Embodiments of the apparatus can include one or more of the following features and/or features of other aspects, such as the features described above in connection with the first aspect. For example, each of the apertures can be the same size and shape.

Alternatively, or additionally, at least some of the apertures can have a different size and/or shape. That is, not all of the apertures in the light blocking material may have the same size and shape as one another.

In general, in a further aspect, the invention features an apparatus that includes a display panel including a first pixel area having a first pixel density and a second pixel area having a second pixel density higher than the first pixel density, the display panel configured to generate images viewable from a front side of the display panel; and a sensor positioned at the back side of the display and arranged to receive incident light transmitted from the front side of the display to the back side of the display through the first pixel area. The first pixel area includes light emitting pixels arranged in pixel clusters and signal lines electrically connecting pixel circuits associated with the pixel clusters. The display panel includes a layer having a light blocking material patterned to provide apertures to transmit the incident light between the pixel clusters and the signal lines and to block the incident light from the pixel clusters and the signal lines. The apertures are arranged such that they introduce a haze of less than 1.9% measured using a method compliant with ASTM D1003.

Embodiments of the apparatus can include one or more of the features described above in connection with the first aspect and/or the other aspect.

According to another further aspect, the invention features an apparatus that includes a display panel having a first pixel area having a first pixel density and a second pixel area having a second pixel density higher than the first, the panel configured to generate images viewable from a front side and a sensor positioned at the back side arranged to receive incident light transmitted from the front to the back through the first pixel area. The first pixel area has light emitting pixels and signal lines electrically connecting pixel circuits associated with the pixels, and the panel includes a layer having a light blocking material patterned to provide apertures to transmit the incident light between some of the light emitting pixels and the signal lines and to block the incident light from the pixel circuits and the signal lines. Apertures can have different dimensions.

Embodiments of the apparatus can include one or more of the features described above in connection with the first aspect and/or the other aspect.

Among other advantages, embodiments disclosed herein can provide high quality images from cameras situated beneath a display panel. For example, embodiments can include a mask layer to reduce scattering and/or diffraction of light that traverses the display panel to the camera. Mask layers can be designed to reduce direction dependent scattering (e.g., along the horizontal and/or vertical axes) and/or large angle scattering (e.g., scattering into angles of 20° or more). The mask layer can block the light from the pixel circuits and/or trace lines connecting pixels, reducing scattering and/or diffraction therefrom.

Embodiments can further provide bezel-less devices, such as smartphones or tablet computers that feature front facing cameras that can capture high quality images.

Other features and advantages will be apparent from the description, drawings, and claims.

BRIEF DESCRIPTION OF THE DRAWINGS

FIGS. 1A and 1B are a plan view and cross-sectional view of a smartphone featuring a display with a front-facing camera beneath the display panel.

FIG. 2A is a diagram showing a pixel cluster pattern of an area of the display shown in FIG. 1A with a high pixel density.

FIG. 2B is a diagram showing a pixel cluster pattern of an area of the display shown in FIG. 1A with a low pixel density.

FIG. 3A is a cross-sectional view of a display that includes a mask layer for a low pixel density area.

FIG. 3B is schematic showing a plan view of a pixel arrangement of the display shown in FIG. 3A.

FIG. 3C is a schematic showing a plan view of a mask layer suitable for the pixel arrangement shown in FIG. 3B.

FIG. 10A is a schematic showing a plan view of another pixel arrangement that includes clusters of pixels.

FIG. 10B is a plan view of a mask layer suitable for masking the pixel arrangement of FIG. 10A.

FIG. 10C shows an intensity plot of a point spread function (PSF) of the mask pattern shown in FIG. 10A.

DETAILED DESCRIPTION

Figure 4A:
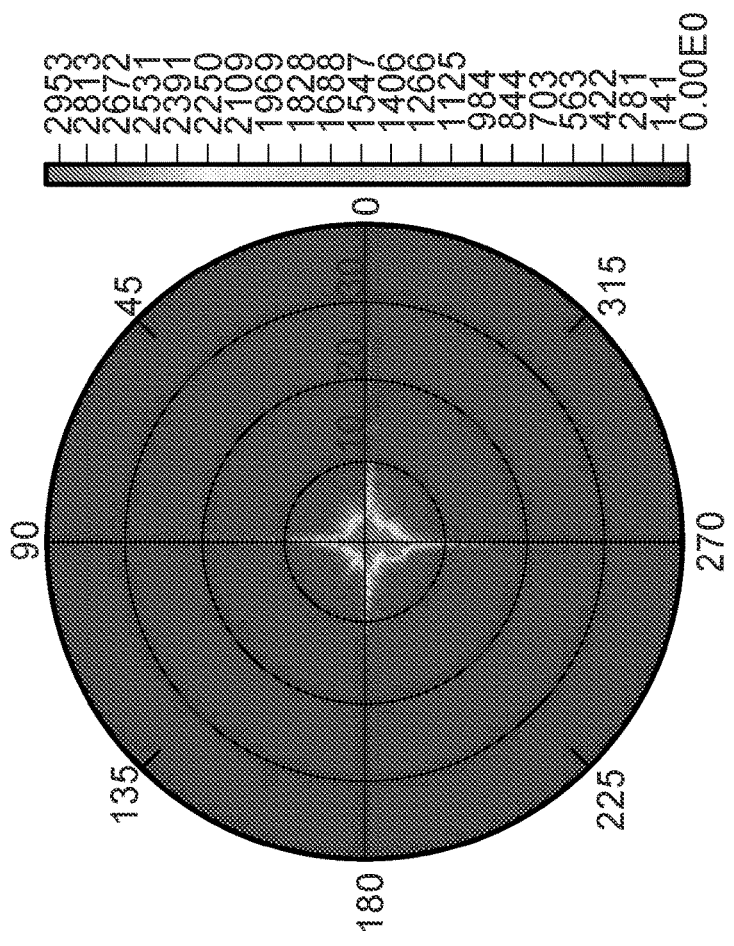
FIG. 4A shows a microscope photograph of an example mask pattern.

Referring to FIGS. 1A and 1B, a smartphone 100 includes an organic light emitting diode (OLED) display 110 that includes an area 112 with a high pixel density and an area 114 with a low pixel density.

A camera 130 (and/or other sensor) is positioned behind the display under area 114. Camera 130, which is composed of a lens and a pixelated sensor, sees and captures images through area 114 of the display. This means that the detected light is transmitted by each layer of display 110, including the display panel 115, touch panel 125, and cover glass 121. Display panel 115, in turn, includes a number of layers including OLED layer 116 composed of light emitting elements, and layers 118 of integrated circuits forming pixel circuits and metal lines connecting the pixel circuits. Touch panel 125 also includes metal lines 127.

Referring to FIG. 2A, area 112 of display 110 is composed of pixel clusters 210 arrayed with a high density (e.g., 100 pixels per inch (ppi) or more, 200 ppi or more, 300 ppi or more, 400 ppi or more, 500 ppi or more, such as 600 ppi or less). In the embodiment illustrated, each pixel cluster 210 is composed of a first pixel 210a having a red sub-pixel 211, and a green sub-pixel 213, and a second pixel 210b having a blue sub-pixel 212, and a green sub-pixel 213. In other cases, pixels can have other combinations of RGB sub-pixels (e.g., one red, one green, one blue) and/or other combinations of sub-pixel colors (e.g., cyan, yellow, magenta). Horizontal and vertically oriented metal traces for electrical connections between each sub-pixel and drivers that facilitate operation of the pixels.

Referring to FIG. 2B, area 114 of display 110 has a lower pixel density than area 112. In this case, area 114 has a pixel density that is one quarter the pixel density of area 112. Because area 112 and area 114 are arranged on the same array of metal trace lines, it means that there are array sites in area 114 in which there are only horizontal trace lines (e.g., site 230), sites where there are only vertical trace lines (e.g., site 240), and sites where there are no (or substantially no) vertical or horizontal trace lines (e.g., site 220). More generally, the low pixel density area can have a pixel density that is 50% or less (e.g., 40% or less, 30% or less, 20% or less, 10% or less, 5%) than the pixel density of area 112.

Generally, the material (i.e., electrically conducting material, such as a metal) forming the horizontal and vertical traces is opaque or reflective at visible wavelengths. Moreover, the close spacing of the traces between adjacent pixels can give rise to diffraction and/or scattering of light as it passes through the display to camera 130.

In order to reduce the scattering and/or diffraction that arises from the traces, it is possible to form an opaque mask layer that blocks light before it interacts with the traces and pixel circuits. The mask layer includes apertures in the pixel free and trace free areas for the passage of light through the low pixel density area to the camera. An example of this is shown in FIGS. 3A-3C, in which a display 300 includes a mask layer 301 on the front facing surface of a touch panel 310. In the present example, mask layer 301 is formed between touch panel 310 and a passivation layer 320 formed on the touch panel. Display 300 also include a polarizer 330 between passivation layer 320 and a cover glass 340, which provides the exposed surface of display 300.

Display 300 also includes an OLED display panel 350, which includes a thin film encapsulation layer 351 that encapsulates a cathode layer 352 and an OLED layer 353. The OLED layer 353 is formed from regions (e.g., columns or rows) of light emitting polymer to provide different areas capable of emitting different wavelengths of light. A circuit layer 355 underneath OLED layer 353 includes pixel circuits 356 and trace lines 357. A polyimide layer 358 and protection film 359 protect the backside of circuit layer 355.

While mask layer 301 is positioned on a top surface of touch panel 310, more generally, it can be formed at other locations in a display panel. For example, a mask layer can be formed between the touch panel and the encapsulation film of the OLED display panel. Ideally, mask layer should be formed between the circuit layer of the OLED display panel and the top of the display. However, in certain embodiments the mask layer can be formed between the circuit layer and the back of the display. In such cases, the mask layer blocks light after the light has interacted with the circuit layer (i.e., light that is scattered and/or diffracted from the elements in the circuit layer). Alternatively, or additionally, in some cases, one or more layers of touch panel 310 itself can be patterned to form the mask layer and/or an additional layer included within touch panel 310 to provide the mask layer. For example, one or more metal layers in the touch panel 310 can be patterned to provide the mask layer.

Generally, the mask layer is formed from a material that is opaque (e.g., reflective and/or absorptive) to the light that is detected by the under-display sensor, e.g., visible light. For example, mask layer can be formed from a black matrix material (e.g., a black colored resin) commonly used in displays. Metals can also be used. For example, Molybdenum, Silver, or Aluminum can be used for the opaque mask layer. Alloys or stacks of several different materials can also be used for the layer.

FIG. 3B shows an example of OLED layers 353 and a circuit layer 360 the arrangement of horizontal lines 363 and vertical lines 362 between pixels for this example, as well as the traces 364 connecting the pixel circuits. In this example, one pixel cluster is composed of two pixels (one pixel with red and green sub-pixels, the other with blue and green sub-pixels, which is conventional pentile pixel arrangement). Here, each pixel cluster includes emissive areas for a red sub-pixel 371, a blue sub-pixel 372, and two green sub-pixels 373.

A mask layer 380 for circuit layer 360 shown in FIG. 3C. The mask layer 380 includes apertures 381 and opaque areas corresponding to the vertical (382) and horizontal (383) traces, and opaque areas (384) overlaying the pixel circuits. Apertures 381 are provided in the free areas where there are no traces. Additional apertures 391-393 are included in opaque areas 384 over the sub-pixels to allow for emission of light from the sub-pixels. The additional apertures may be referred to as pixel apertures.

FIG. 4A shows a micrograph of a mask layer which represent the projection view of a low pixel density area of an OLED display. Here, the opaque material is depicted in cross-hatching and defines an array of rectilinear apertures. Each aperture has the same size and shape. The use of a mask layer that creates the aperture such as shown in FIG. 4A is believed to greatly reduce haze in the display panels. However, it is further believed that the shape and arrangement of the apertures can result in scattering and/or diffraction that, despite the reduction in haze, can degrade images acquired by an image sensor beneath the display.

Figure 4B:
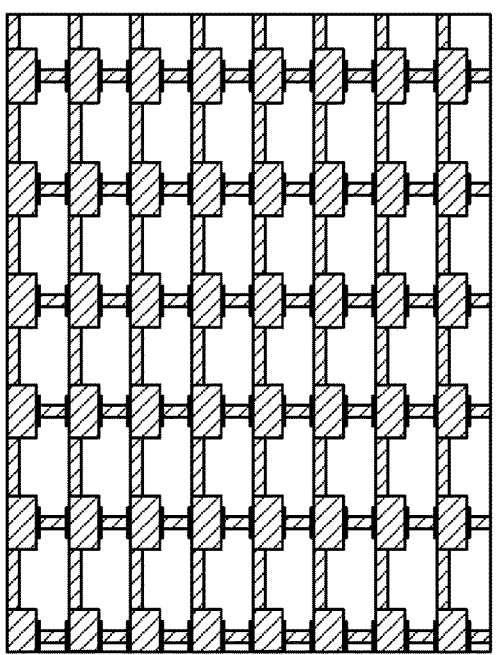
FIG. 4B shows a photograph of a point spread function (PSF) of the mask pattern shown in FIG. 4A.
Figure 4C:
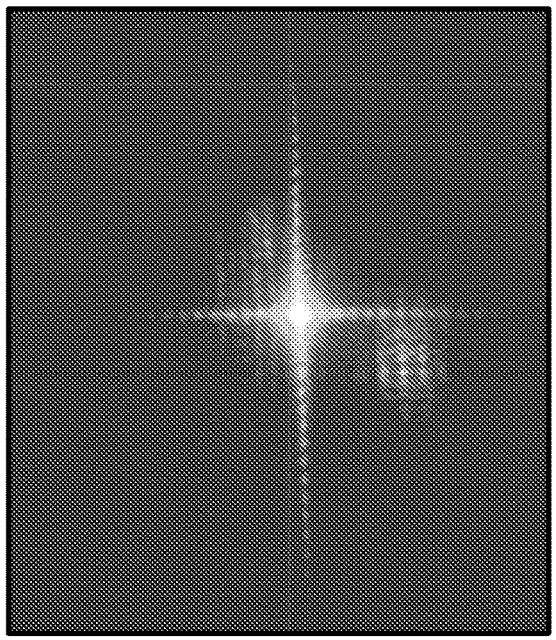
FIG. 4C shows an intensity plot of the PSF shown in FIG. 4B.

FIG. 4B shows a point spread function (PSF) measured from the mask layer shown in FIG. 4A. The measurement was made by directing a collimated laser beam through the mask substantially normal to the plane of the mask. Haze for this example was measured using an ASTM D1003 compliant haze meter (e.g., Rhopoint Novo-Haze TX Haze Meter or BYK Gardner Haze-Gard i (4775) Haze Meter) to be 1.9%. A significant amount of the light is diffracted into non-zero diffracted orders. The diffracted light is particularly pronounced along the vertical and horizontal axes and includes higher orders that extend to large angles. This is due to the rectilinear nature of the aperture array. The intensity of the PSF as a function of angle is shown in the intensity plot in FIG. 4C.

While the foregoing example of a mask layer features a regular pattern of apertures, it is believed that reducing the periodicity of the array along each of the principle directions (vertical or horizontal) can reduce the effect of diffraction for transmitted light. Moreover, while the apertures in the mask layer are all the same shape, it is further believed that varying the size and/or shape of the apertures can reduce diffraction and/or scattering effects and result in reduced chromatic artifacts. Accordingly, examples of mask patterns are described which feature non-periodic arrays of apertures and/or apertures of different size and/or shape. Such mask layers can reduce haze of collimated light normally incident thereon to less than 1.9% (e.g., 1.8% or less, 1.7% or less, 1.6% or less, 1.5% or less, 1.4% or less, 1.3% or less, 1.2% or less, 1.1% or less, 1% or less, such as 0.5%).

For example, mask patterns can have apertures that are spaced with at least two different periodicities in the horizontal and/or vertical directions. Generally, the spacing between apertures depends on the size of the pixel elements and pixel circuits being masked by the mask layer. The spacing (in the horizontal and/or vertical directions) can be 10 µm or more (e.g., 20 µm or more, 30 µm or more, 40 µm or more, 50 µm or more, up to 1 mm, up to 500 µm, up to 250 µm, up to 100 µm, up to 75 µm).

In general, mask layers can include apertures that have differing dimensions, e.g., different horizontal widths, different vertical heights, and/or different areas. Generally, the dimensions of apertures can vary but should be sufficiently large to allow for light transmission sufficient for operation of the behind-display sensor. For example, apertures can have at least one dimension of 20 µm or more (e.g., 30 µm or more, 50 µm or more, 75 µm or more, 100 µm or more, 150 µm or more, 200 µm or more, such as up to 400 µm, up to 350 µm, up to 300 µm, up to 250 µm). Apertures can have an area of 50 µm$^2$ or more (e.g., 100 µm$^2$ or more, 200 µm$^2$ or more, 400 µm$^2$ or more, 500 µm$^2$ or more, 750 µm$^2$ or more, 1,000 µm$^2$ or more, up to 1,500 µm$^2$, up to 1,250 µm$^2$).

Mask layers can include apertures of two or more different shapes including, without limitation, rectilinear shapes (e.g., squares, rectangles) and curved shapes (e.g., circles and ellipses).

In low pixel density areas, pixels can be arranged periodically or non-periodically in the horizontal and/or vertical directions. For example, multiple pixels (e.g., two, three, four, five, six or more) can be clustered together, separated by different distances in the horizontal and/or vertical directions.

Figure 5B:
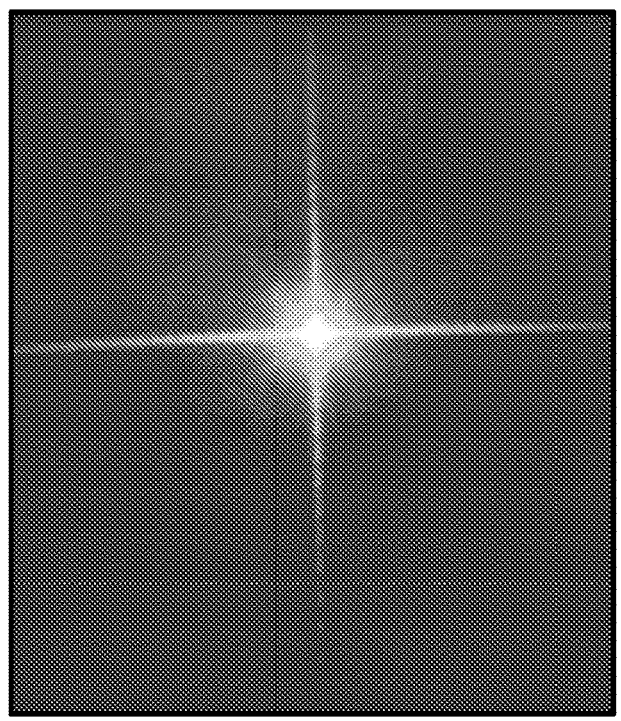
FIG. 5B shows a photograph of a point spread function (PSF) of the mask pattern shown in FIG. 5A.
Figure 5A:
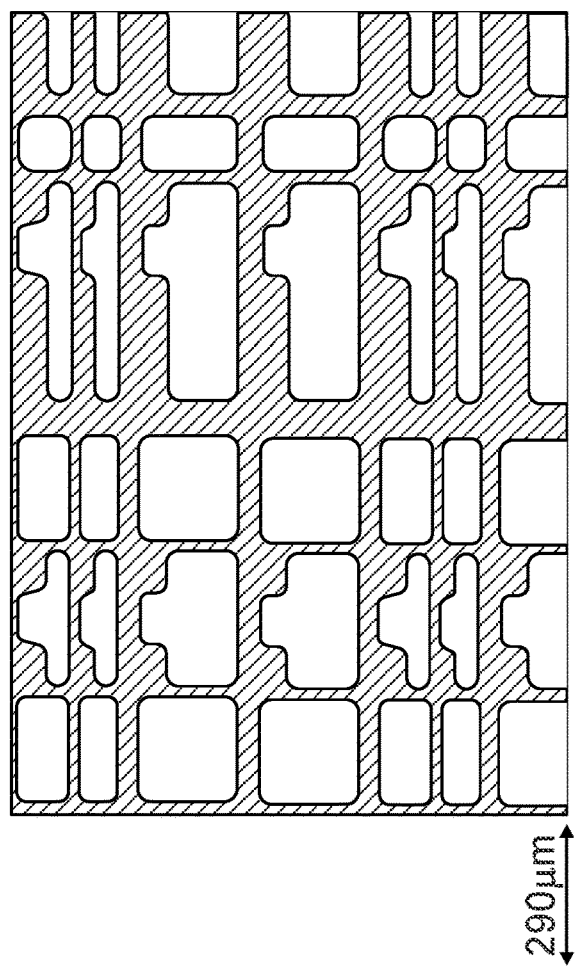
FIG. 5A shows a microscope photograph of a further example of a mask pattern.

FIG. 5A shows an example mask pattern in which the periodicity of the aperture pattern is reduced compared to the mask layer shown in FIG. 4A. Specifically, while the apertures are all substantially rectilinear, their size and shape differs. For instance, the vertical extent of the apertures in different rows varies and the horizontal extent of the apertures in different columns varies. The spacing between adjacent rows and columns also varies. A scale is provided at the bottom left hand side of the photograph.

FIG. 5B shows a PSF measured from the mask layer shown in FIG. 5A. The measurement was made by directing a collimated laser beam through the mask substantially normal to the plane of the mask. Haze for this example was measured to be 1.3%, a 32% improvement over the haze measured for the example in FIG. 4A. Nevertheless, a significant amount of the light is scattered along the vertical and horizontal axes. This is believed to be due to the rectilinear nature of the aperture array. However, compared to the PSF shown in FIG. 4B, the diffraction peaks along the vertical and horizontal directions are less pronounced and diffraction peaks away from these directions is significantly reduced.

Figure 6C:
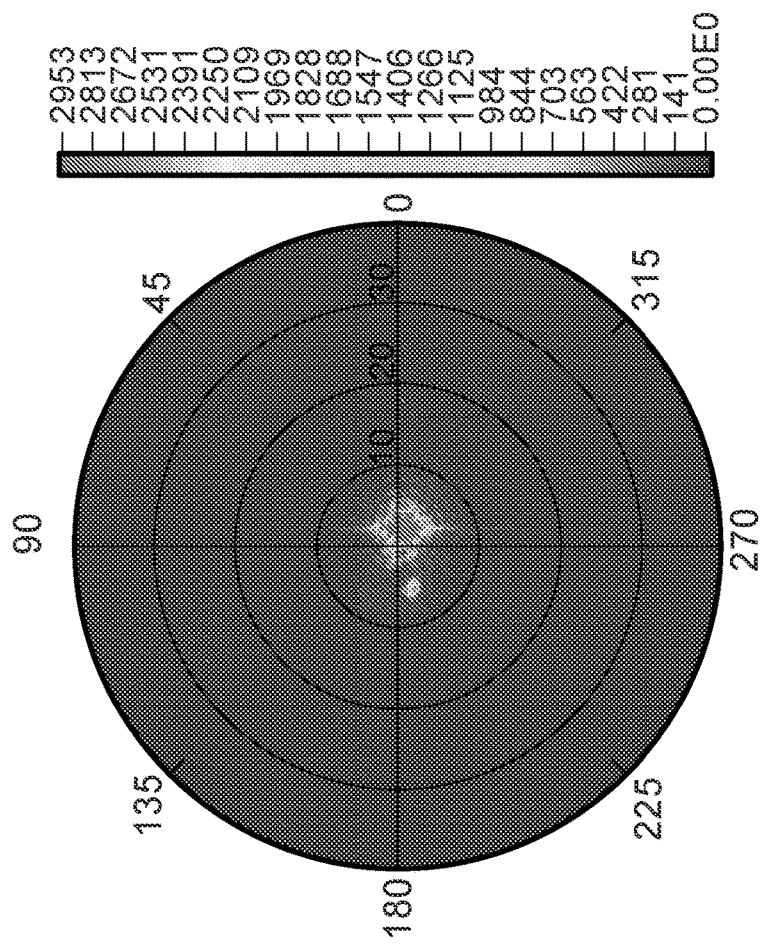
FIG. 6C shows an intensity plot of the PSF shown in FIG. 6B.
Figure 6A:
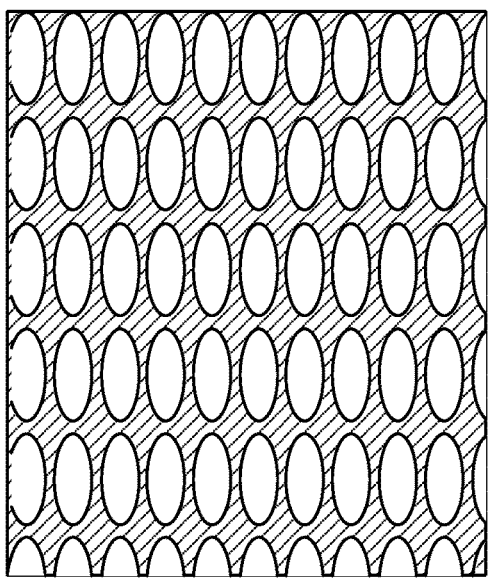
FIG. 6A shows a microscope photograph of another example of a mask pattern.

While the foregoing examples feature mask layers that include rectilinear apertures, other shaped apertures are also possible. For example, elliptical or circular apertures can be used. FIG. 6A shows a micrograph of an example of a mask layer that includes a regular array of elliptical apertures. The elliptical apertures have their major axes aligned in the horizontal direction and their minor axes aligned in the vertical direction. The spacing between apertures along each row is the same and the spacing between the apertures along each column is the same.

Figure 6B:
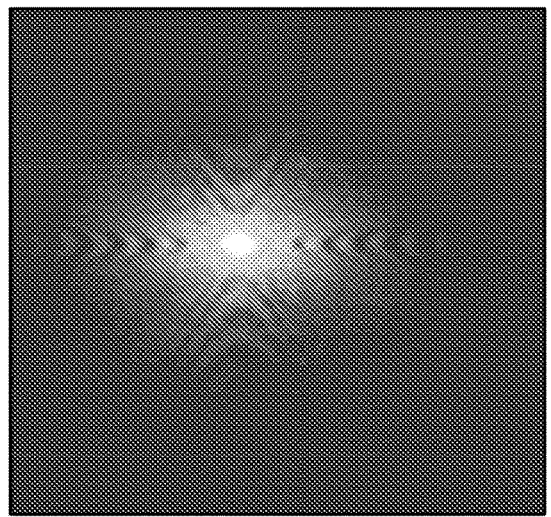
FIG. 6B shows a photograph of a point spread function (PSF) of the mask pattern shown in FIG. 6A.

FIG. 6B shows a PSF measured from the mask layer shown in FIG. 6A. The measurement was made by directing a collimated laser beam through the mask substantially normal to the plane of the mask. Haze was measured to be 1.7%, a decrease of approximately 10% compared to the mask layout shown in FIG. 4A. Furthermore, compared to the PSFs shown in FIGS. 4B and 5C, scattering along the horizontal and vertical axes is reduced (i.e., directional scattering is reduced). Also, there is more scattering in the vertical direction than the horizontal direction. This is believed to be due to the elliptical shape of the apertures. The intensity of the PSF as a function of angle is shown in the intensity plot in FIG. 6C and demonstrates a reduction in large angle scattering compared to the intensity plot in FIG. 4C.

Figures 7A, 7B, 7C:
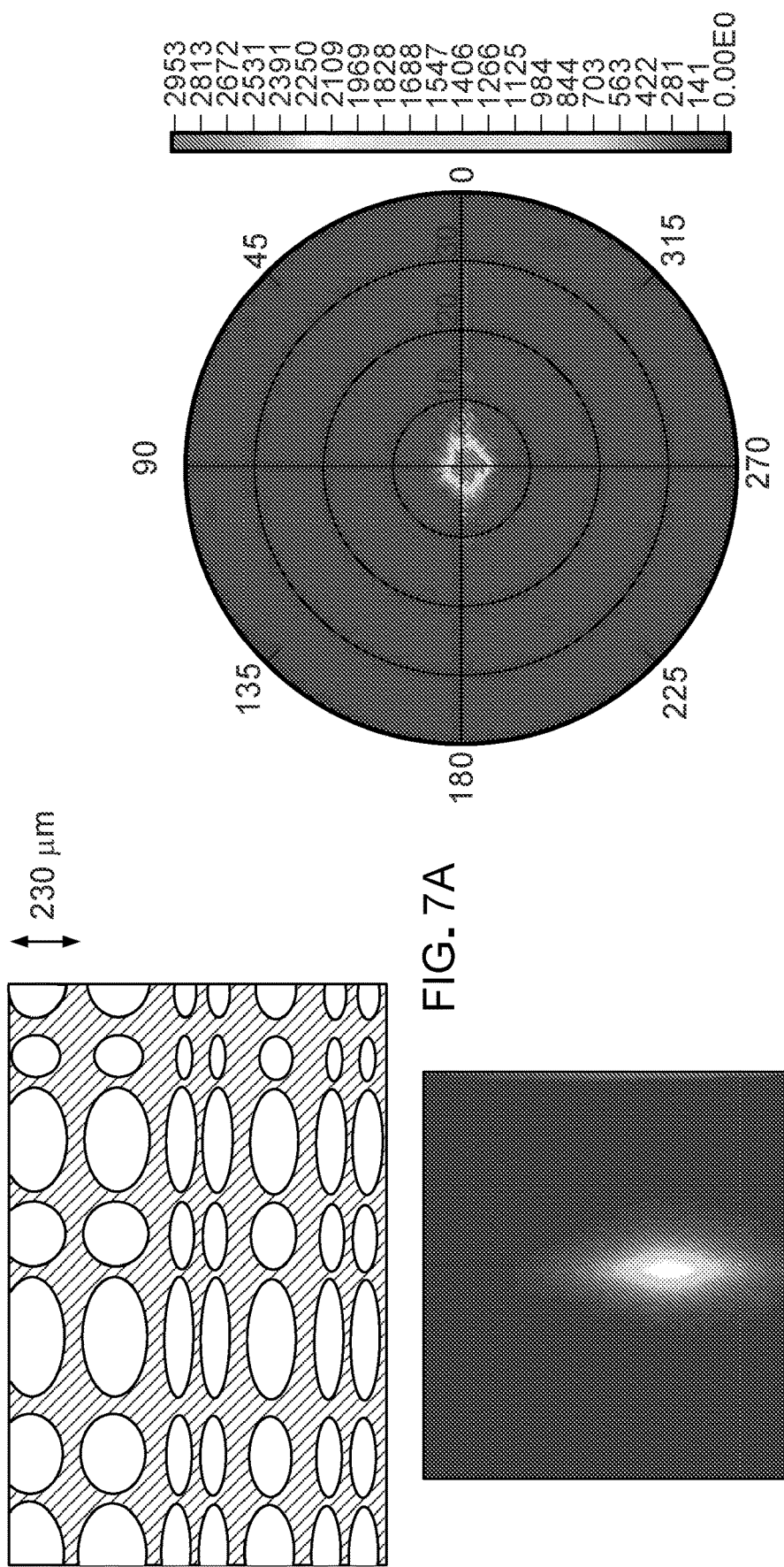
FIG. 7A shows a microscope photograph of another example of a mask pattern.
FIG. 7B shows a photograph of a point spread function (PSF) of the mask pattern shown in FIG. 7A.
FIG. 7C shows an intensity plot of the PSF shown in FIG. 7B.

Non-rectilinear shaped apertures can also be arranged in irregular patterns. For example, a mask can include elliptical and/or circular apertures of different area, ellipticity, and/or spacing. FIG. 7A shows a micrograph of an example of a mask that includes an irregular array of elliptical apertures. Here, each elliptical apertures in a row (in the horizontal direction) has the same vertical height and each elliptical aperture in a column (in the vertical direction) has the same horizontal width.

FIG. 7B shows a PSF measured from the mask layer shown in FIG. 7A. The measurement was made by directing a collimated laser beam through the mask substantially normal to the plane of the mask. Compared to the PSF shown in 6B, scattering into high angles is reduced. Also, there is more scattering in the vertical direction than the horizontal direction. The intensity of the PSF as a function of angle is shown in the intensity plot in FIG. 7C, demonstrating a reduction in both directional scattering and large angle scattering compared to the intensity plot in FIG. 4C.

While the low density pixel arrangement shown in FIG. 2B features pixels that are spaced apart from each other by a single array site in both the horizontal and vertical directions, other arrangements are possible. For example, pixels can be separated by more than one array site in either direction. Alternatively, or additionally, pixels can be arranged in adjacent array sites, forming pixel clusters.

Figure 8A:
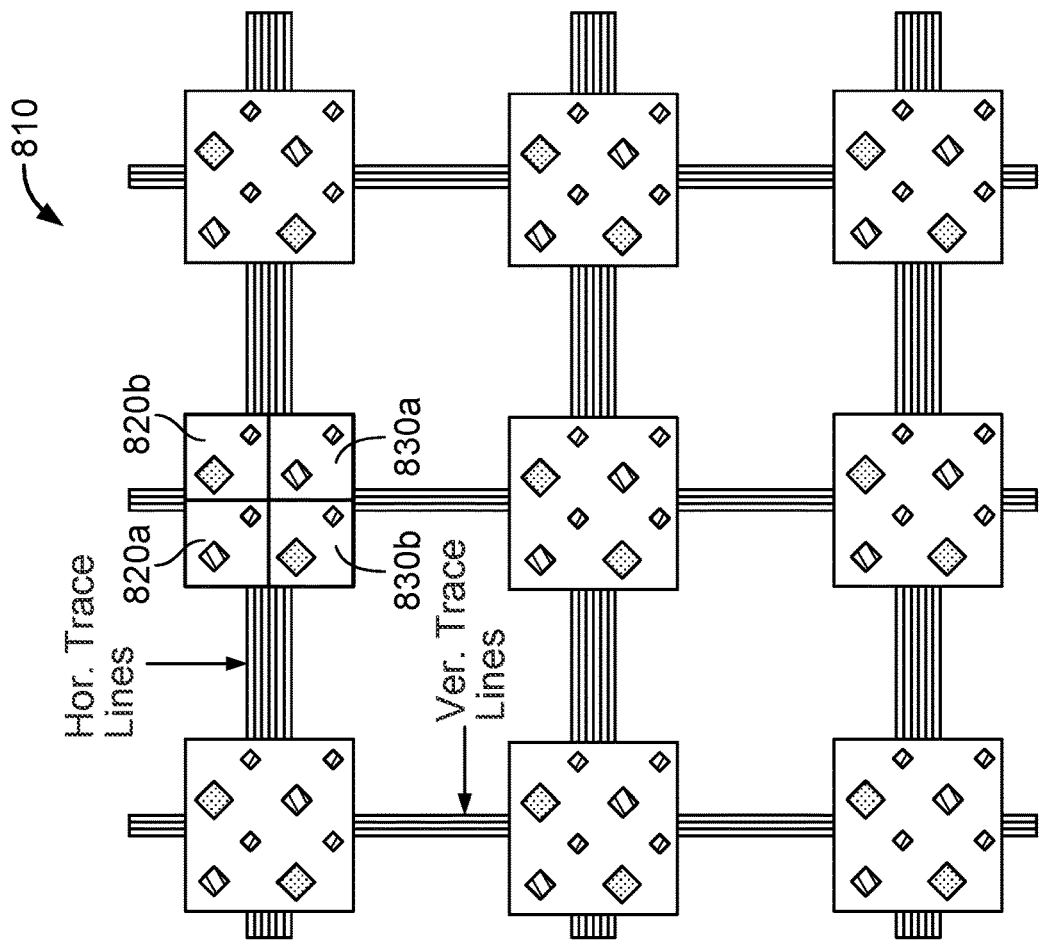
FIG. 8A is a schematic showing a plan view of a pixel arrangement that includes clusters of pixels.
Figure 8B:
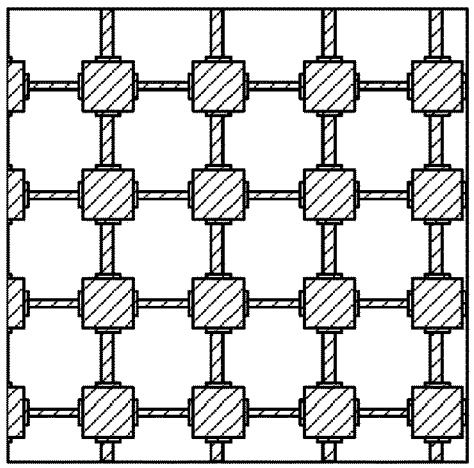
FIG. 8B is a plan view of a mask layer suitable for masking the pixel arrangement of FIG. 8A.
Figure 8C:
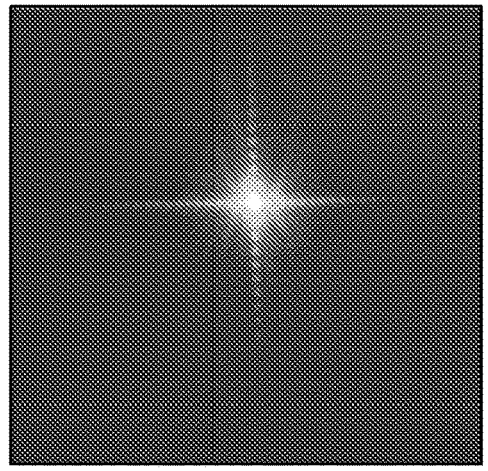
FIG. 8C shows a photograph of a point spread function (PSF) of the mask pattern shown in FIG. 8A.

Generally, low density pixel areas can include a regular arrangement of pixel clusters where each cluster has the same pixel arrangement, or pixel clusters can differ. Pixel clusters can include two, three, four or more pixels. Pixel clusters can be square, rectangular, or take on other shapes. An example of a pixel arrangement that includes pixel clusters is shown in FIG. 8A. Here, each pixel cluster 810 includes four pixels 820*a, b,* 830*a, b* arranged in a square. FIG. 8B shows a mask layer suitable for masking the pixel cluster arrangement and signal lines shown in FIG. 8A. FIG. 8C shows the PSF from this mask layer.

In the foregoing examples, each row and column of pixel clusters are connected by horizontal and vertical signal lines that are collinear. In other words, each pixel cluster in a row is connected by horizontal signal lines that each lie along a common horizontal line. Similarly, vertical signal lines that lie along common vertical lines connect each pixel cluster in a column. This arrangement is shown in the example in FIG. 8A.

A mask layer suitable for masking the arrangement in FIG. 8A is shown in FIG. 8B and is composed of rectilinear cross-shaped apertures. The resulting PSF is shown in FIG. 8C.

However, other arrangements of the signal lines are also possible. For example, one or more signal lines linking pixel clusters is a column and/or in a row can be offset from the signal line connecting the adjacent pixel cluster. For example, referring to FIG. 9A, in an example embodiment, alternate vertical signal lines 920 are offset in a horizontal direction so that the horizontal distance between signal lines in adjacent columns varies. Similarly, alternate horizontal signal lines 930 in a row are offset in a vertical direction so that the vertical distance between signal lines in adjacent rows varies.

Figure 9A:
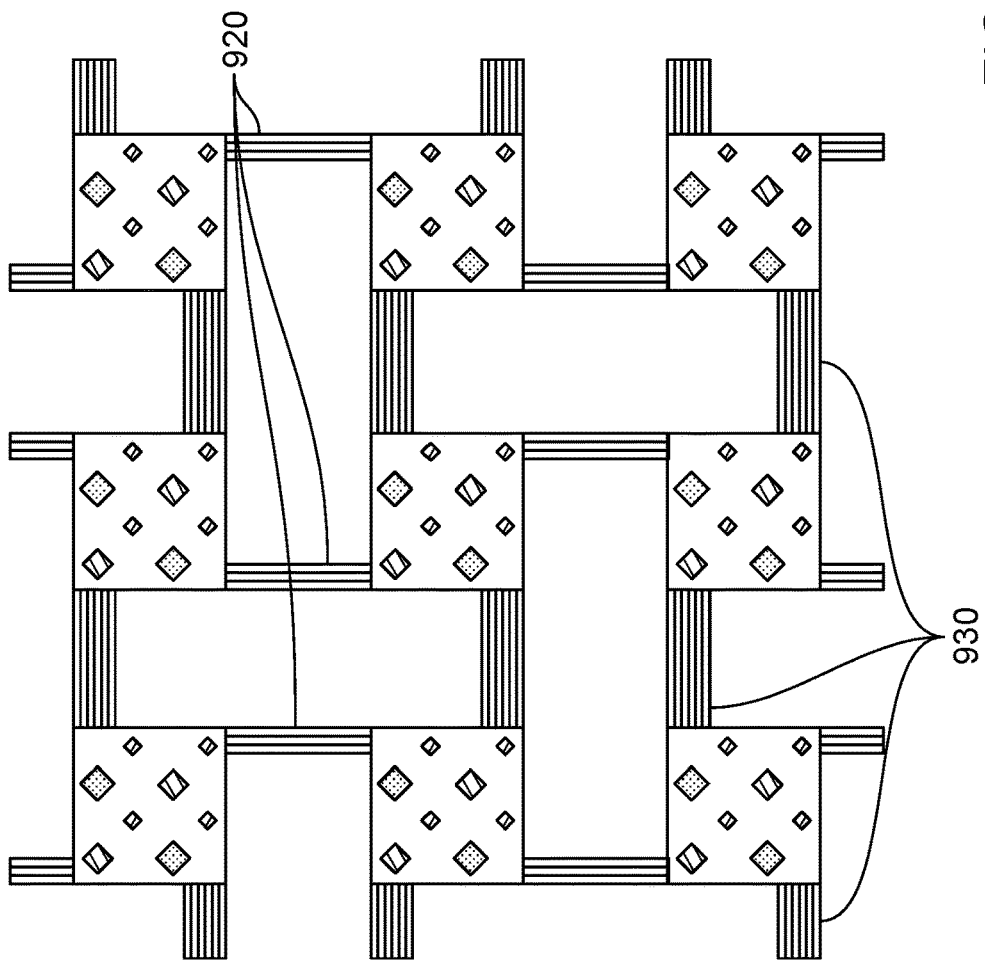
FIG. 9A is a schematic showing a plan view of another pixel arrangement that includes clusters of pixels.
Figure 9B:
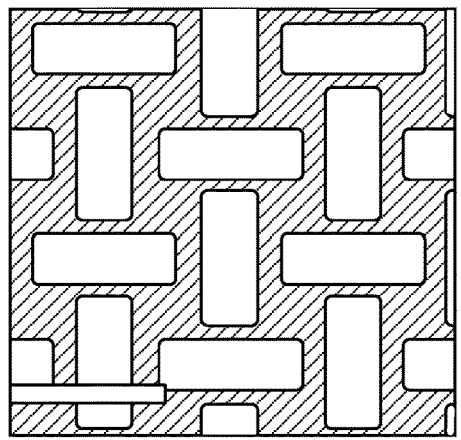
FIG. 9B is a plan view of a mask layer suitable for masking the pixel arrangement of FIG. 9A.
Figure 9C:
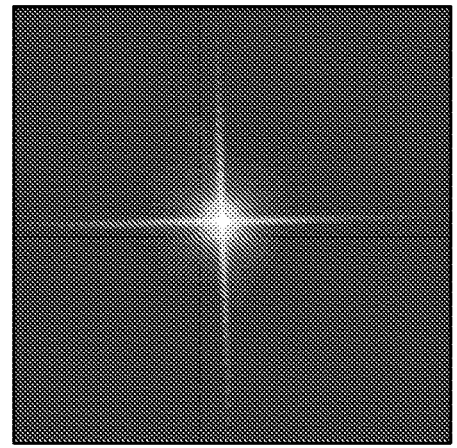
FIG. 9C shows a photograph of a point spread function (PSF) of the mask pattern shown in FIG. 9A.
Figure 9D:
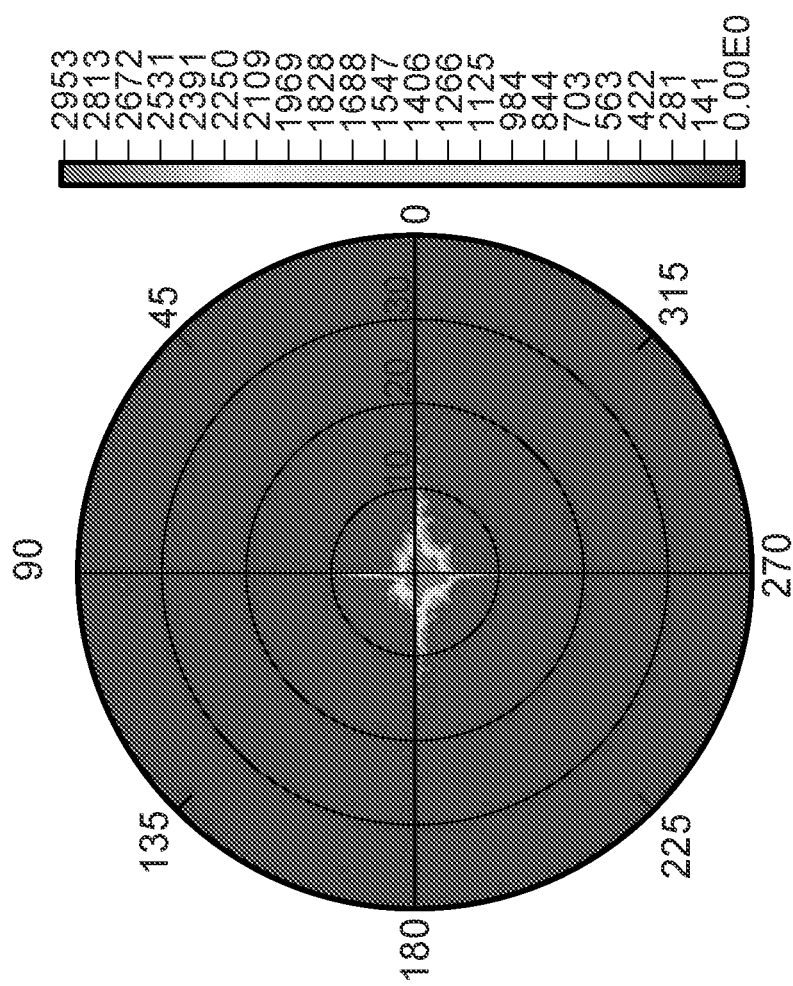
FIG. 9D shows an intensity plot of the PSF shown in FIG. 9C.

FIG. 9B shows a mask layer 950 suitable for the pixel arrangement shown in FIG. 9A. Mask layer 950 is composed of rectangular apertures arranged in columns and rows where the orientation of adjacent apertures are rotated at right angles with respect to each other. A photograph showing a PSF for mask layer 950 is shown in FIG. 9C and an intensity plot of the PSF is shown in FIG. 9D. The PSF demonstrates lower light scattering into most directions away from the vertical and horizontal axes. Without wishing to be bound by theory, it is believed that this is due to the mask shape having fewer periodic inflection points than the mask layer shown in FIG. 8B.

A mask layer with non-rectilinear apertures can also be used to mask circuit structures shown in FIG. 9A. For example, FIGS. 10A and 10B show and example of such a mask layer 1050, which is composed of ellipses of similar size in which alternating ellipses have their major axis horizontally oriented (1010) and vertically oriented (1020).

FIG. 10C shows a photograph of a PSF for mask layer 1050. As is evident from the PSF, the mask layer reduces higher angle scattering compared to the mask layers shown in FIG. 8B and FIG. 9B.

Figure 11B:
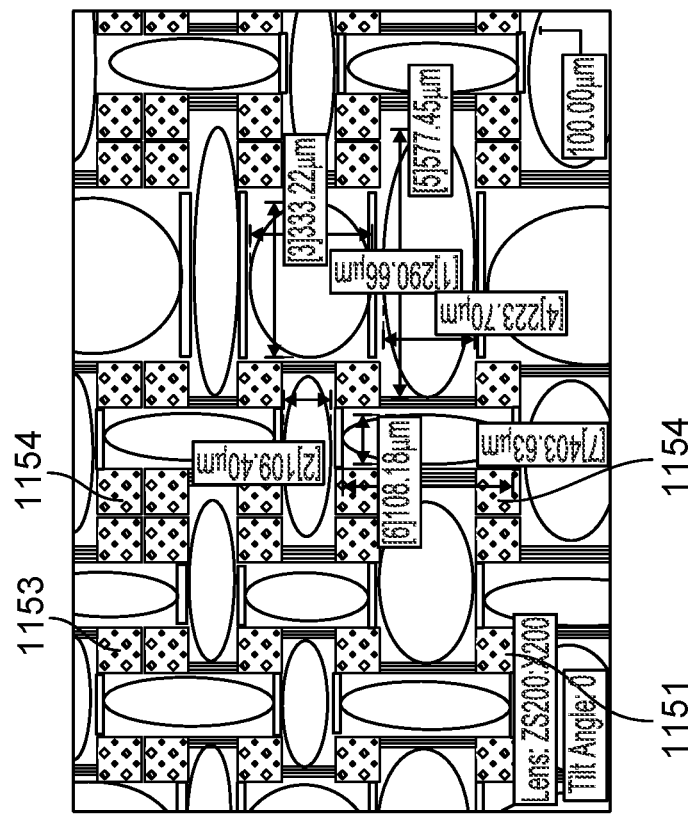
FIG. 11B is the microscope photograph shown in FIG. 11A in which the pixel clusters and signal lines are shown.
Figure 11A:
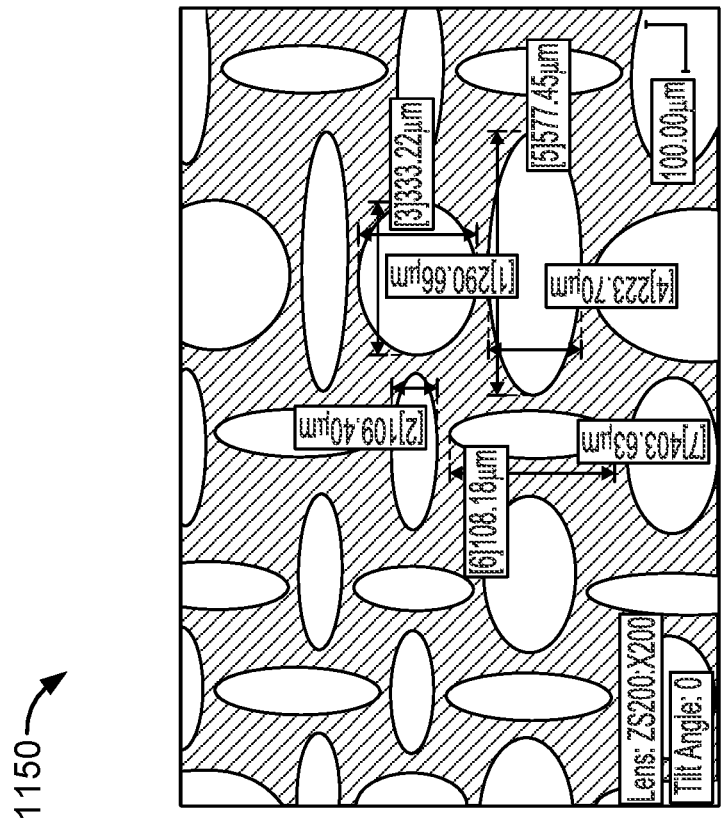
FIG. 11A is a microscope photograph of an example mask layer composed of varying elliptical apertures.

Referring to FIGS. 11A and 11B, which shows a micrograph of a further mask pattern 1150, in certain embodiments, elliptical and/or circular apertures can be utilized in combination with offset signal lines. FIG. 11A shows a microscope photograph of mask pattern 1150. The scale in the bottom right corner shows 100 μm in the horizontal and vertical directions. The elliptical apertures in mask 1150 are non-periodically arranged and the spacing between adjacent apertures varies. The elliptical apertures are arranged such that their major axes extend either vertically or horizontally. In both the vertical and horizontal directions.

FIG. 11B shows the same microscope photograph as FIG. 11A, but has the pixel clusters and signal lines overlaid. As illustrated, the size of the pixel clusters varies. For example, the smallest pixel clusters (e.g., 1151) include two pixels (each containing four sub-pixels) and the largest pixel clusters (e.g., 1152) contain eight pixels. Pixel clusters (e.g., 1153, 1154) containing four pixels form rectangles arranged extending vertically and horizontally. In this layout, the pixel clusters are arranged in rows of constant vertical height (e.g., corresponding to one or two pixels) and columns of constant horizontal width (e.g., corresponding to one or two pixels). Other arrangements are also possible.

The bundled signal lines have varying bundled width and spacing in both the horizontal and vertical directions. Each bundled signal lines includes the signals lines required for the operation of clustered pixels in connection with the signal lines.

Figure 12:
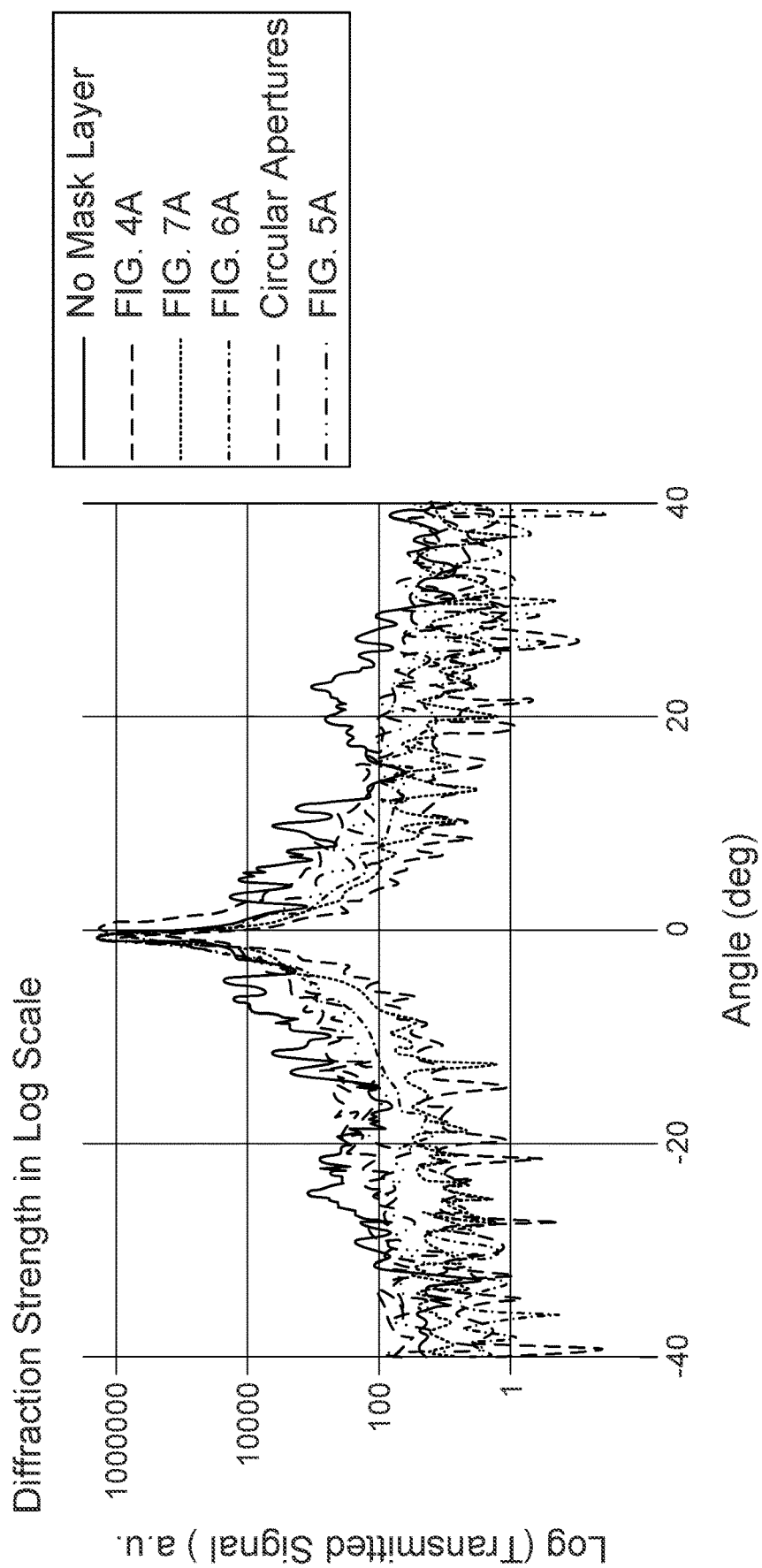
FIG. 12 is a plot showing transmitted intensity as a function of scattering angle for several different mask layers.

FIG. 12 shows a plot of transmitted signal strength as a function of diffraction angle for several different aperture arrangements and compared them to a display that has no mask layer. The vertical axis has a logarithmic scale. As is evident from the plot, scattering into angles of 20° or greater is significantly reduced for all mask layers compared to no mask layer. Scattering into smaller angles is also reduced, with the most pronounced reductions coming for a mask layer with a regular array of circular apertures and the mask layer shown in FIG. 7A.

While certain embodiments are disclosed, other implementations are also possible. For example, while the display panel described above is an OLED display, the principles disclosed herein can be applied to other display technologies too, such as microLED displays. Furthermore, mask layers can be applied to displays featuring multiple areas of low pixel density. For instance, where a device features more than one front facing sensor behind the display, each sensor can be positioned behind a corresponding low pixel density area having a mask layer.

Other embodiments are in the following claims.

What is claimed is:

1. An apparatus, comprising:
   a display panel comprising a first pixel area having a first pixel density and a second pixel area having a second pixel density higher than the first pixel density, the display panel configured to generate images viewable from a front side of the display panel; and
   a sensor positioned at a back side of the display panel and arranged to receive incident light transmitted from the front side of the display to the back side of the display panel through the first pixel area, wherein:
      the first pixel area comprises light emitting pixels and signal lines electrically connecting pixel circuits associated with the light emitting pixels, and
      the display panel comprises a layer comprising a light blocking material patterned to define apertures to transmit the incident light between at least some of the light emitting pixels and the signal lines and to block the incident light from the pixel circuits and the signal lines,
   wherein the apertures comprise elliptical apertures of differing ellipticity.

2. The apparatus of claim 1, wherein at least some of the light emitting pixels are arranged in pixel clusters.

3. The apparatus of claim 2, wherein the pixel clusters comprise two or more pixels.

4. The apparatus of claim 1, wherein a separation between the light emitting pixels varies in at least one direction.

5. The apparatus of claim 1, wherein the apertures are arranged non-periodically in the first direction.

6. The apparatus of claim 1, wherein the first direction is a horizontal direction.

7. The apparatus of claim 6, wherein at least some of the apertures have a different dimension in a vertical direction orthogonal to the horizontal direction.

8. The apparatus of claim 1, wherein the apertures are arranged non-periodically in the second direction.

9. The apparatus of claim 1, wherein at least some of the apertures are rectilinear in shape.

10. The apparatus of claim 1, wherein at least some of the apertures are circular in shape.

11. The apparatus of claim 1, wherein the apertures comprise elliptical or circular apertures of differing size.

12. The apparatus of claim 1, wherein at least some of the apertures have a dimension of 50 μm or more.

13. The apparatus of claim 1, wherein the sensor is a camera.

14. The apparatus of claim 1, wherein the apparatus is a smartphone or a tablet computer.

15. The apparatus of claim 1, wherein the display panel is an organic light emitting diode (OLED) display.

16. The apparatus of claim 1, wherein the apertures introduce a haze of less than 1.9% measured using a method compliant with ASTM D1003.

* * * * *